United States Patent
Kobayashi et al.

[11] Patent Number: 6,028,263
[45] Date of Patent: Feb. 22, 2000

[54] THERMOELECTRIC POWER GENERATING APPARATUS AND METHOD FOR DRIVING SAME

[75] Inventors: Masakazu Kobayashi, Kanagawa; Kazuhiko Shinohara, Yokohama; Keiko Kushibiki, Kanagawa; Kenji Furuya, Yokohama, all of Japan

[73] Assignee: Nissan Motor Co., Ltd., Yokohama, Japan

[21] Appl. No.: 09/069,981

[22] Filed: Apr. 30, 1998

[30] Foreign Application Priority Data

| May 14, 1997 | [JP] | Japan | .................................... | 9-124354 |
| Feb. 20, 1998 | [JP] | Japan | .................................... | 10-039254 |

[51] Int. Cl.$^7$ .................................................. H01L 35/34
[52] U.S. Cl. .......................................... 136/201; 136/205
[58] Field of Search ................................... 136/200, 201, 136/203, 205

[56] References Cited

U.S. PATENT DOCUMENTS

| 5,439,528 | 8/1995 | Miller | ...................................... | 136/200 |
| 5,446,437 | 8/1995 | Bantien et al. | ............................ | 338/25 |
| 5,491,452 | 2/1996 | Ohtsubo et al. | ........................ | 327/552 |
| 5,498,296 | 3/1996 | Sawada et al. | ....................... | 136/236.1 |
| 5,507,879 | 4/1996 | Gyoten et al. | .......................... | 136/224 |
| 5,565,763 | 10/1996 | Arrendale et al. | ..................... | 323/360 |
| 5,576,512 | 11/1996 | Doke | ........................................ | 136/203 |
| 5,705,770 | 1/1998 | Ogasawara et al. | ..................... | 136/205 |
| 5,708,371 | 1/1998 | Koyama | .................................... | 324/752 |

FOREIGN PATENT DOCUMENTS

| 8-32125 | 2/1996 | Japan . |
| 8-37322 | 2/1996 | Japan . |

*Primary Examiner*—Kathryn Gorgos
*Assistant Examiner*—Thomas H Parsons
*Attorney, Agent, or Firm*—Foley & Lardner

[57] ABSTRACT

An apparatus for generating a thermoelectric power and method for driving the same. The disclosed apparatus comprises: a plurality of power generation units, each power generator unit including at least one thermocouple and being capable of mutually generating an equal output voltage; a connection form switch for switching an electrical connection form of each one of the power generator units between a serial connection of the corresponding one of the power generator units to another of the remaining power generator units and a parallel connection thereof to another of the remaining power generator units; a parallel voltage detector for measuring a parallel voltage when the plurality of power generator units are connected in parallel to each other; a connection form detector for determining the connection form of all of the power generator units in one of three forms consisting of a serial connection, a parallel connection, and a combination of the serial and parallel connections, so as to generate a thermoelectric power according to a load connected to the thermoelectric power generating apparatus on the basis of a value of the parallel voltage measured by the parallel voltage measuring block; and a broken wire detector for detecting whether a wire breakage in each of the power generator units occurs.

20 Claims, 11 Drawing Sheets

THERMOELECTRIC POWER GENERATING APPARATUS AND METHOD FOR DRIVING SAME

The respective contents of Japanese Patent Application No. Heisei 9-124354 filed May 14, 1997 and Japanese Patent Application No. Heisei 10-39254, filed Feb. 20, 1998 are herein incorporated by reference.

BACKGROUND OF THE INVENTION

1. Field of the Invention

The present invention relates generally to a thermoelectric power apparatus to generate electric power utilizing the Seebeck effect. More particularly, the present invention relates to a thermoelectric power apparatus and method for optimally generating electric power according to a temperature variation and a temperature distribution of a heat source, and to an apparatus and method for avoiding a reduction of generated electric power due to wire breakage so as to secure long life and high reliability.

2. Description of the Related Art

Various thermoelectric power generating apparatuses have been proposed to generate electric power utilizing the Seebeck effect. A thermoelectromotive force generated due to the Seebeck effect is dependent upon a temperature difference between a high-temperature heat source and a low-temperature heat source. Hence, output voltages of the previously proposed thermoelectric power generating apparatuses tend to fluctuate. That is to say, the output voltages normally lower from a desired voltage or remarkably increase in comparison with the desired voltage according to the temperature variation and the temperature distribution of the heat source.

To cope with such a fluctuation in the output voltage as described above, it has been proposed to utilize a plurality of thermoelectric modules, each thermoelectric module having a plurality of couples of thermoelectric devices which are connected to one another. An electrical connection of these thermoelectric modules is switched from a series connection to a parallel connection and vice versa to generate electric power according to a load.

One example of a thermoelectric power generating apparatus utilizing the above-described technique of switching the connection form of the plurality of thermoelectric modules between a series connection and a parallel connection is disclosed in a Japanese Patent Application First Publication No. Heisei 8-37322, published on Feb. 6, 1996. In that Japanese Patent Application First Publication, a thermoelectric power generating apparatus is applied to an electric cell for a watch. The switching of the connection form of the plurality of thermoelectric modules is performed on the basis of the output voltage of a particular thermoelectric module from among the plurality of thermoelectric modules, and electric power is supplied to electric charging means, such as a secondary electric cell.

On the other hand, since the electromotive force generated utilizing the Seebeck effect is generally small, it is necessary to connect several thermoelectric devices in series to obtain a large amount of electric power. For example, in a thermoelectric power generating apparatus that generates electric power as large as several watts through several hundred kilowatts, a relatively high temperature heat source such as an incinerator's heat or exhaust gas heat from an automotive vehicle is used. In such cases, however, reliability is reduced due to electrical line (wire) breakage.

To increase the reliability of the thermoelectric power generating apparatus as described above, it has been proposed to use a technique in which the occurrence of electrical line (wire) breakage of the devices constituting the thermoelectric power generating apparatus or of the thermoelectric modules is detected so as not to adversely affect functions of normal devices or normal thermoelectric modules. One example of this technique is disclosed in Japanese Patent Application First Publication No. Heisei 8-32125 published on Feb. 2, 1996. In this Japanese Patent Application First Publication, such a method is disclosed wherein the thermoelectric devices in each thermoelectric module are divided into a plurality of blocks. The occurrence of the electrical wire (line) breakage is detected, and any one or more of the blocks in which the occurrence of the line breakage is detected are electrically bypassed through a bypass circuit arranged in parallel to each block.

However, in the thermoelectric power generating apparatuses disclosed in Japanese Patent Application Publication No. Heisei 8-37322, the switching of the connection form between a serial connection and a parallel connection on the basis of the output voltage of the particular thermoelectric module is carried out. In a case where any line in the particular thermoelectric module is broken and the output voltage has failed, the electric charging cannot be made completely, In the line breakage detecting method disclosed in Japanese Patent Application First Publication Heisei 8-32125, an external power supply is connected to a series circuit constituted by the thermoelectric module and a comparison (pull down) resistor. As a result, a current is caused to pass through the series circuit, a voltage comparison is made between a voltage drop in the thermoelectric module and a reference voltage is used to detect whether the line breakage occurs in the thermoelectric module. Hence, it is impossible to accurately determine the line breakage while the voltage (the thermoelectromotive force) is generated in the thermoelectric module. That is to say, while the voltage is generated, the occurrence of a line breakage cannot be detected. If the line breakage has occurred during the operation of the thermoelectric module, the generation of the thermoelectric force cannot completely be advanced. In addition, an external power supply is used. Hence, a cost of manufacturing such thermoelectric module as described in the latter Japanese Patent Application Publication is increased. Power generation cannot be made any more while the determination of whether the line breakage occurs is carried out. Further, the algorithm for line breakage determination is complex and is time consuming. Consequently, efficiency of power generation is reduced.

SUMMARY OF THE INVENTION

It is an object of the present invention to provide a thermoelectric power generating apparatus and a method for driving the same which can optimally generate electric power according to a temperature variation and a temperature distribution of a heat source, which can determine an occurrence of an electrical line breakage at an arbitrary time regardless of a time of an operation of the apparatus itself, and which apparatus and method are highly reliable, low cost, and highly efficient.

According to one aspect of the present invention, there is provided a thermoelectric power generating apparatus, comprising: a plurality of power generator units, each power generator unit including at least one thermocouple and being capable of mutually generating an equal output voltage; a connection form switch for switching an electrical connection form of each one of the power generator units between a serial connection and a parallel connection with respect to another of the remaining power generator units; a parallel voltage detector for measuring a parallel voltage when the plurality of power generator units are connected in parallel to each other; a connection form detector for determining the connection form of all of the power generator units in one of three forms consisting of a serial connection, a parallel connection, and a combination of the serial and parallel connections, so as to generate thermoelectric power according to a load connected to the thermoelectric power generating apparatus on the basis of a value of the parallel voltage measured by the parallel voltage measuring block; and a broken wire detecting block for detecting whether a wire breakage in each of the power generator units occurs.

According to another aspect of the present invention, there is provided a thermoelectric power generating apparatus, comprising: a plurality of power generator units, each power generator unit including at least one thermocouple and being capable of mutually generating an equal-output voltage; connection form switching means for switching an electrical connection form of each one of the power generator units between a serial connection and a parallel connection with respect to another of the remaining power generator units; parallel voltage measuring means for measuring a parallel voltage when the plurality of power generator units are connected in parallel to each other; connection form determining means for determining the connection form of all of the power generator units in one of three forms so as to generate a thermoelectric power according to a load connected to the thermoelectric power generating apparatus on the basis of a value, of the parallel voltage measured by the parallel voltage measuring means; and broken wire detecting means for detecting whether a wire breakage in each of the power generator units occurs.

According to a still another aspect of the present invention, there is provided a method for driving the above-described generating apparatus. This method comprises the steps of: measuring the parallel voltage of the power generator units connected in parallel with each other through the parallel voltage measuring block; detecting whether a wire breakage in each of the power generator units occurs; determining a thermoelectric power start time at which the thermoelectric power generating apparatus starts the thermoelectric power generation from the measured parallel voltage; determining the connection form of the power generator units in three forms consisting of a serial connection, a parallel connection, and a combination of the serial and parallel connections from the measured parallel voltage; and interconnecting the power generator units in the determined connection form to generate the thermoelectric power.

BEST MODE FOR CARRYING OUT THE INVENTION

Reference will hereinafter be made to the drawings in order to facilitate a better understanding of the present invention.

Figure 1:
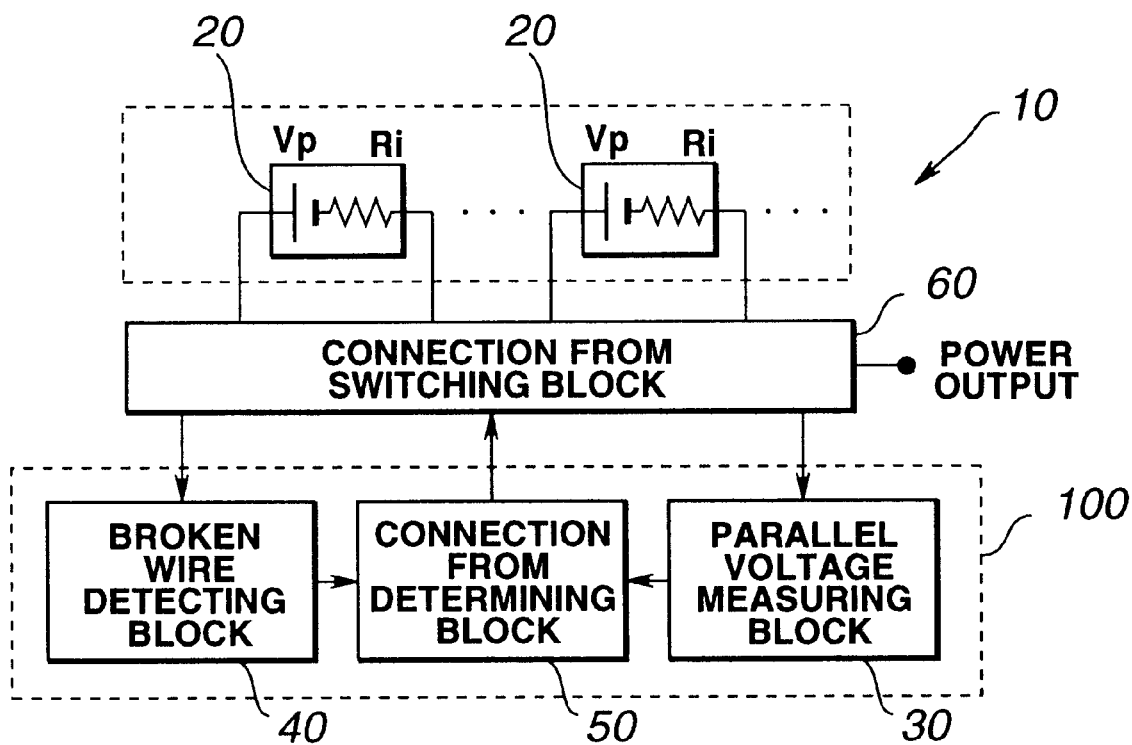
FIG. 1 is a schematic block diagram of a thermoelectric power generating apparatus according to a first preferred embodiment of the present invention.

FIG. 1 shows a block diagram of a first preferred embodiment of a thermoelectric power generating apparatus in accordance with the present invention.

In FIG. 1, the thermoelectric power generating apparatus 10 includes: a plurality of thermoelectric modules, each thermoelectric module having one or more thermocouples and providing mutually the same (equal) output voltage, or a plurality of thermoelectric module blocks 20, each thermoelectric module block 20 having the plurality of the thermoelectric modules which are connected in series with each other or connected in parallel to each other so as to provide mutually the same output voltage. A parallel voltage detector shown as block 30 measures each parallel voltage Vp of power generator units when the power generator units are connected in parallel to each other. Each power generator unit is constituted by the respective thermoelectric modules or by the respective thermoelectric module blocks. A broken wire (connection line) detector, shown as block 40 detects whether a connection line (wire) is broken in any one or more of the power generator units. A connection form detector, shown as block 50 determines a combination of a serial and/or parallel connection, i.e., determines an electrical connection form between the respective power generator units on the basis of information derived from the parallel voltage measuring block 30 and the broken wire detecting block 40. A connection form switch, shown at block 60 switches the connection form between the respective power generator units on the basis of an output signal of the connection form detector.

It is noted that the parallel voltage detector 30, the connection form detector 50, and the broken wire detector 40 are functionally incorporated into a controller 100.

Figure 2:
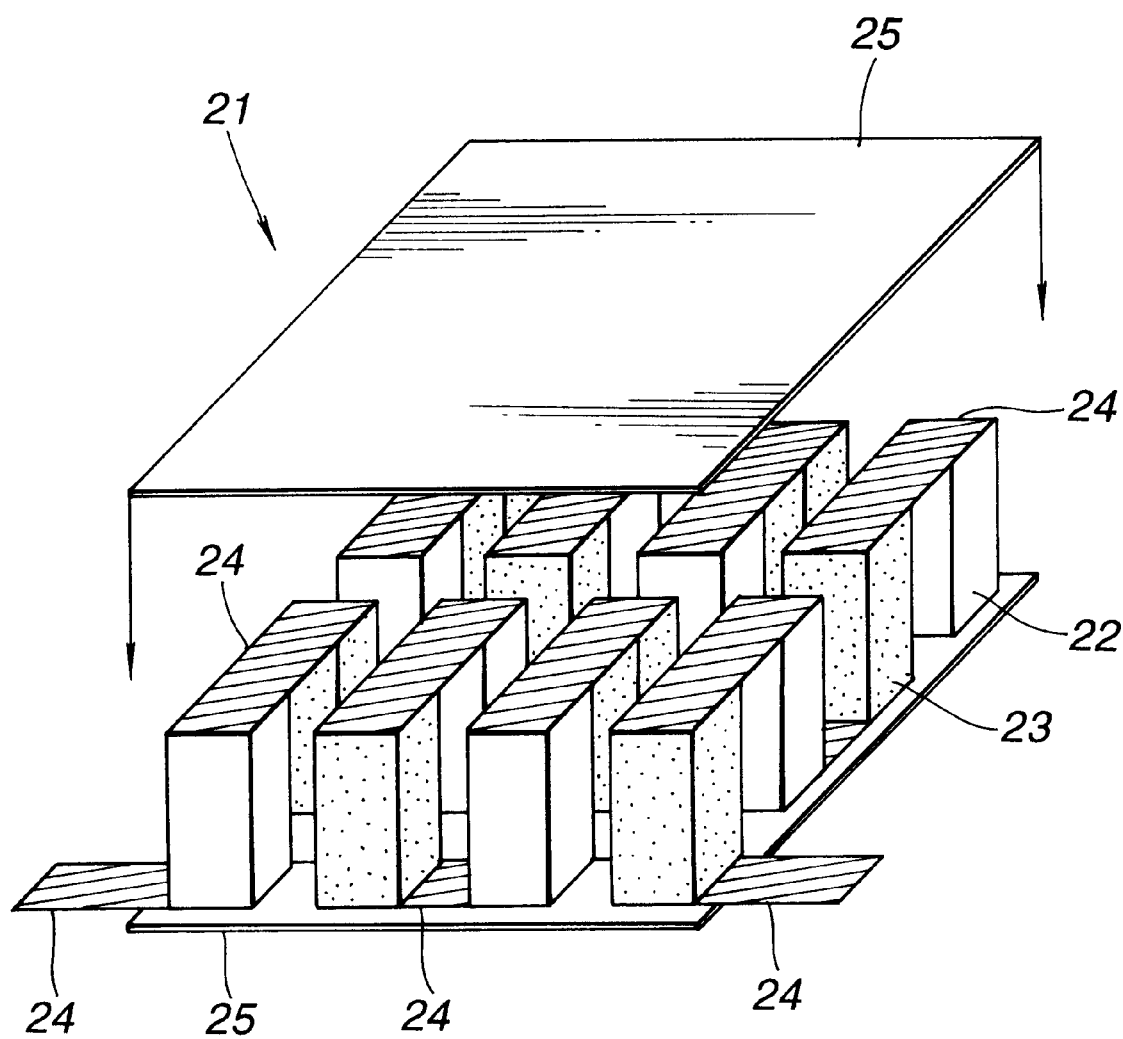
FIG. 2 is a schematic perspective view of a thermoelectric module for use in the thermoelectric power generating apparatus according to the present invention.

FIG. 2 shows a structure of a representative one of the thermoelectric power generator units which is a unit of the switching of the electrical connection.

As shown in FIG. 2, one thermocouple is constituted by an N-type thermocouple element 22 and a P-type thermocouple element 23. The thermocouples, for example, eight thermocouples are electrically connected to each other using metal electrodes 24. Furthermore, a pair of electrically insulative substrates 25, which provide electrically insulating characteristics and maintain mechanical strength for one of the thermoelectric modules 21, are used to grasp the metal electrodes 24 to form the one thermoelectric module 21. In addition, the plurality of the thermoelectric modules 21 each shown in FIG. 2 are serially connected together to form the one thermoelectric module block 20 shown in FIG. 1.

Figure 3:
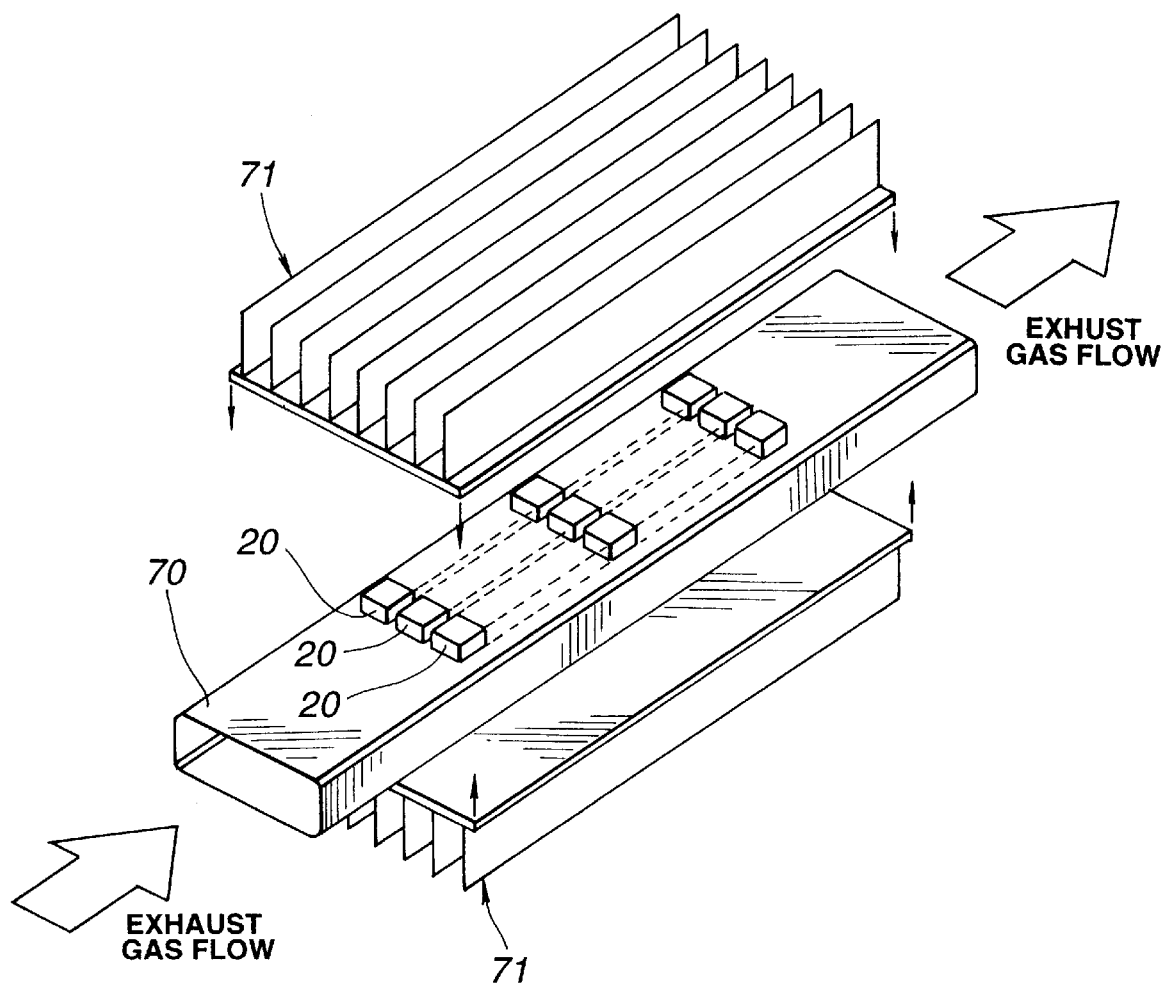
FIG. 3 is a perspective view of a thermoelectric power generating apparatus in accordance with an embodiment of the invention in which exhaust gas of an automotive vehicular engine is used as a heat source.

FIG. 3 shows an example of the thermoelectric module blocks 20 in which engine exhaust gas of an automotive vehicle is used as a heat source. For example, in a case where a flow of heat in a single direction is provided, such as where exhaust gas of a vehicle is used as the heat source, temperatures of the exhaust gas at its upstream side and at its downstream side are generally different. Hence, as shown in FIG. 3, for example, ten of the same rated thermoelectric modules 21 are electrically connected in series with each other to form the single thermoelectric module block 20. In addition, the single thermoelectric module block 20 constitutes the power generator unit and six power generator units are disposed so as to enclose an exhaust tube 70 of the vehicular engine in such a way that three of the power generator units are disposed in parallel at an upper side of the exhaust tube 70 and the remaining three thereof are disposed in parallel at a lower side of the exhaust tube 70.

It is noted that the upper side of the exhaust tube 70 means a front outer surface of the exhaust tube 70 as viewed from FIG. 3 and the lower side thereof means a rear outer surface of the exhaust tube 70 as viewed from FIG. 3.

Consequently, each one of the thermoelectric module blocks 20, i.e., each one power generator unit can provide the same (equal) output voltage as each of the other power generator units.

Furthermore, as shown in FIG. 3, a pair of heat radiating fins 71 are attached onto two groups of the six power generator units to form heat absorption and radiation structure.

Figure 4:
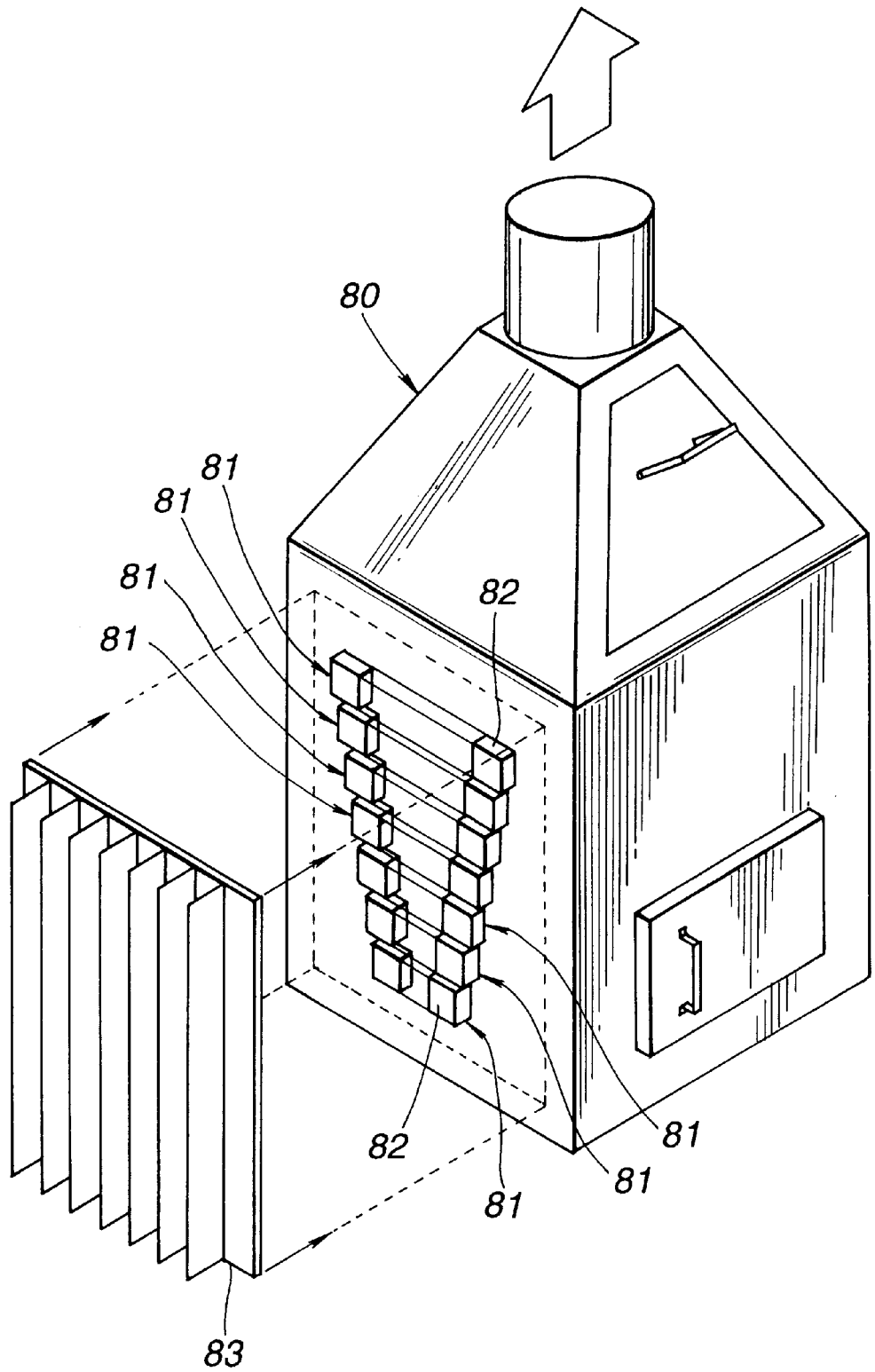
FIG. 4 is a perspective view of the thermoelectric power generating apparatus in accordance with an embodiment of the invention in which an incinerator is used as a heat source.

FIG. 4 shows another example in which the thermoelectric module blocks 20 are applied to an incinerator.

As shown in FIG. 4, the incinerator 80 provides a temperature distribution directed from a downward position of the incinerator 80 toward an upward position thereof and is used as the heat source. In such a case, each of the thermoelectric module blocks 81 in which the same rated thermoelectric modules 82 are horizontally connected in series with each other serves as a corresponding one of the power generator units. The number of connections by which the thermoelectric modules 82 are connected within each power generator unit 81 are properly varied in a vertical direction of the incinerator 80. Another heat radiating fin 83 is attached onto a whole surface of the thermoelectric module block 81 so that the same (equal) output voltage can be provided from each power generator unit. For example, if the temperature is distributed linearly from the downward position to the upward position, the thermoelectromotive force generated due to the Seebeck effect is often approximately linear with respect to the temperature difference. Hence, the number of the thermoelectric modules 82 within each of the power generator units to be disposed vertically on the incinerator 80 may be varied linearly.

As described above, each power generator unit mutually provides the same (equal) output voltage using the same rated thermoelectric modules. Each of the power generator units which switches the connection form between the serial and parallel connection may mutually provide the equal output voltage. Therefore, each power generator unit may be constituted by differently rated thermoelectric modules. In addition, within each power generator unit, the thermoelectric modules may be connected in parallel to each other. Furthermore, each of the thermoelectric modules having the different number of thermocouple elements or each of the thermoelectric module blocks having a different number of thermoelectric module blocks may be adopted.

FIGS. 5A through 5D are examples of each power generator unit.

In FIGS. 5A through 5D, Vp denotes a parallel voltage value of a representative one of the power generator units, and r denotes an internal resistance of the thermoelectric modules constituting the representative one of the power generator units.

Figure 5A:
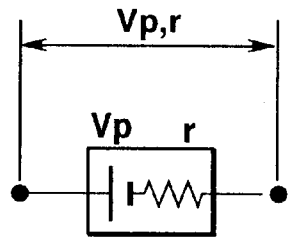
FIGS. 5A, 5B, 5C, and 5D are explanatory views of equivalent circuits of each of thermoelectric power generator units that constitute an essential part of the thermoelectric power generating apparatus according to the present invention.
Figure 5B:
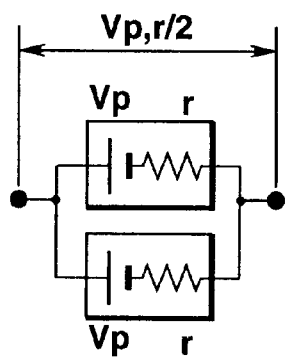
Figure 5C:
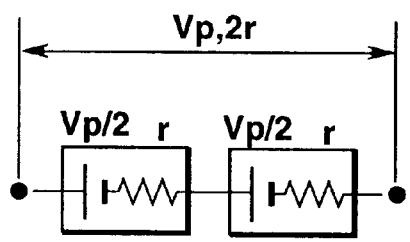
Figure 5D:
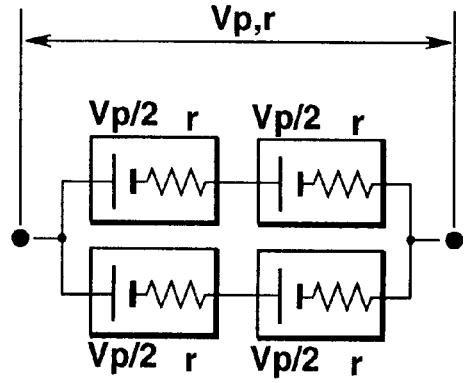

As shown in FIGS. 5B and 5D, in a case where the parallel connection of the thermoelectric modules is also used in addition to the serial connection thereof, the internal resistance r in each power generator unit can be reduced.

As shown in FIG. 5C, in a case where each power generator unit is serially connected together, a large thermoelectric current can be derived. Hence, a power generation efficiency can be improved.

As shown in FIGS. 5B and 5D, in the cases where each power generator unit is connected in parallel together, the line breakage due to the thermoelectric currents being concentrated into a particular thermoelectric module can be prevented. Consequently, the whole system's reliability can be improved.

FIGS. 6A, 6B, 6C, and 6D show examples of the thermoelectric module blocks electrically connected together along the unidirectional heat flow of the heat source which constitute the power generator units.

In FIGS. 6A through 6D, V denotes the output voltage of each thermoelectric module, R denotes the internal resistance of each thermoelectric module, and Rf denotes an external load that is equivalent to the resistance.

Figure 6A:
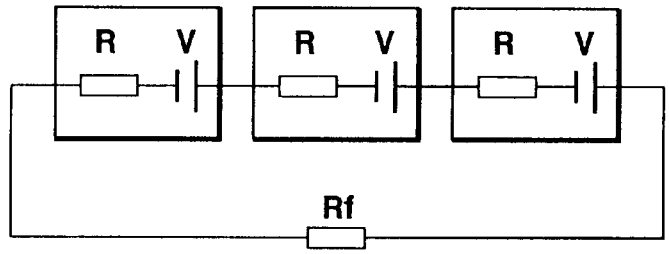
FIGS. 6A, 6B, 6C, and 6D are explanatory views of equivalent circuits of each of thermoelectric power generator units that constitute a part of the thermoelectric power generating apparatus according to the present invention.
Figure 6B:
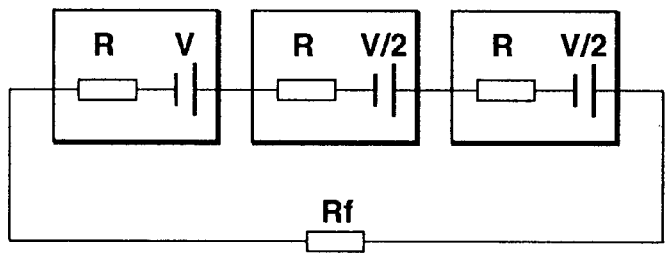

As shown in FIG. 6B, in a case where the thermoelectric modules of the same ratings are connected, it is desirable for all of the thermoelectric modules to provide the same output voltages V. However, due to a reduced thermal capacity of the heat source or due to a high heat exchange efficiency to the heat source, the temperature difference between the upstream and the downstream sides of the heat source becomes remarkably large. Therefore, as shown in FIG. 6B, a remarkable difference may often occur in the output voltages generated by the thermoelectric modules installed at the upstream side of the heat source and at the downstream side thereof.

Figure 6C:
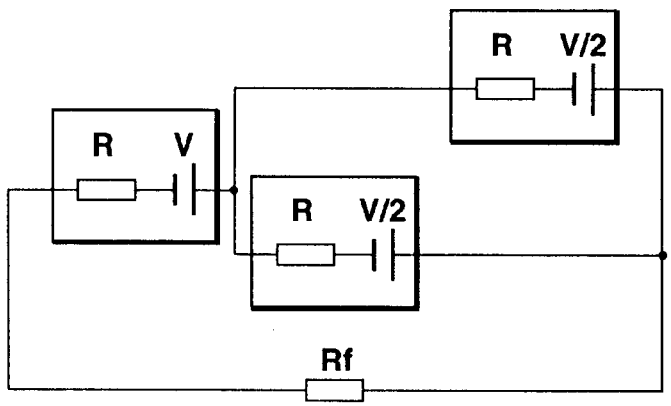
Figure 6D:
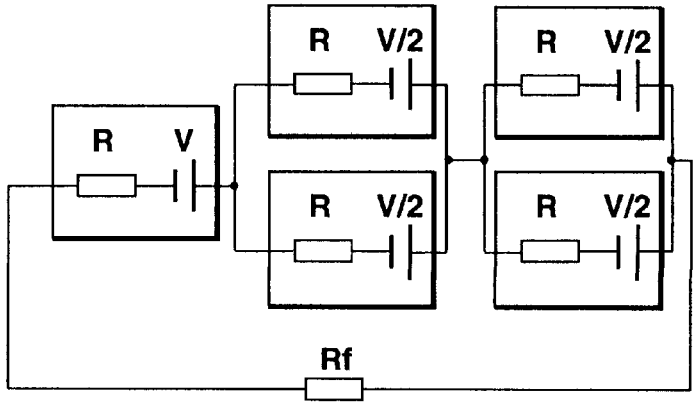

In such a case as described above, for example, in the circuit structure in which the external load Rf (external resistance) is connected, a magnitude of the external load Rf can be varied in accordance with a synthetic resistance of the power generator units. In the case, as shown in FIGS. 6C and 6D, any of the thermoelectric modules having a low generation output voltage is connected in parallel to each other and the thermoelectric modules of the same ratings are connected in parallel to the thermoelectric modules having the lower generation output voltages. Consequently, the electric power Pf supplied to the external load can be enlarged.

On the other hand, in a case where the magnitude of the external load Rf cannot be varied so as to conform to the synthetic resistance of the power generator units, as shown in FIG. 6D, the thermoelectric module having the low output voltage is connected in parallel to the thermoelectric module of the same rating so that the electric power Pf supplied to the external load can be enlarged.

Table 1 shows the relationship between the external load Rf and the electric power Pf described above.

Next, in the thermoelectric power generating unit according to the present invention, a start time of the power generation and the connection form of the respective power generator units are determined using the value of the parallel voltage Vpof each power generator unit which is the unit of switching the electrical connection into the serial or parallel connection.

Figure 7:
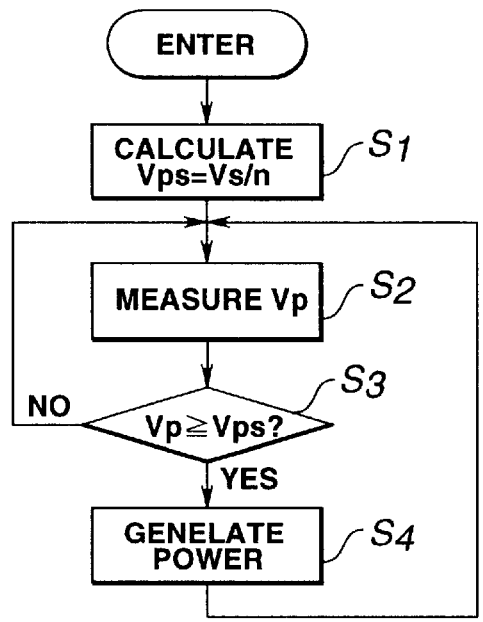
FIG. 7 is a flowchart representing one example of a power generating cycle of the thermoelectric power generating apparatus according to the present invention.

FIG. 7 shows a flowchart indicating one example of a power generation cycle of the thermoelectric power generating apparatus according to the present invention. In the case of FIG. 7, the power is supplied to the external load with n numbers of the normally operated power generator units serially connected together.

First, at a step S1 of FIG. 7, the controller 100 shown in FIG. 1 divides a minimum voltage Vs required for the thermoelectric power generating apparatus to perform the power generation by the number (n) of the power generator units (Vs/n) to set a threshold voltage Vps required for the single power generator unit to perform the power generation.

Next, at a step S2, the controller 100 measures the parallel voltage Vp of the power generator units. At a step S3, the controller 100 compares a value of the parallel voltage Vp with the threshold voltage Vps to determine whether the parallel voltage Vp is equal to or higher than or has been made equal to or higher than the threshold voltage Vps, the routine goes to a step S4 in which the n number of the normally operated power generator units are connected in series with one another and generates the thermoelectric power.

After a constant period of time at which the thermoelectric power generation is performed has passed, the routine returns from step S4 to step S2 to repeat the above-described power generation cycle.

Since the start time of the power generation and the connection form of the power generator units are determined from the parallel voltage Vpof the power generator unit which is the unit of switching the electrical connection not from the voltage across a particular power generator unit, the system's reliability can be improved.

In addition, the broken wire detecting block 40 for detecting the broken wire in any one or more of the power generator units is incorporated into the controller 100 so that the detection of the broken wire is performed for each power generation cycle or intermittently.

Figure 8:
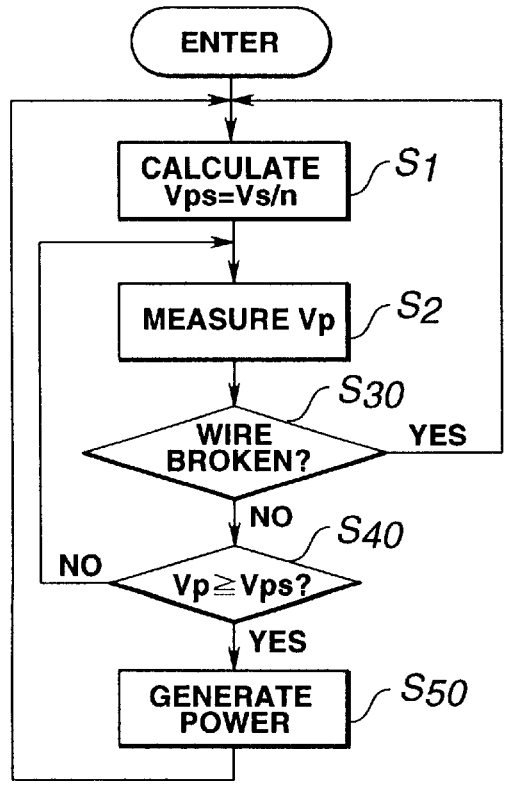
FIG. 8 is a flowchart representing another example of the power generating cycle of the thermoelectric power generating apparatus according to the present invention.

FIG. 8 shows a flowchart for explaining an addition of a broken wire detection operation by the controller 100 shown in FIG. 1.

As shown in FIG. 8, at the first step S1, the controller 100 calculates the threshold voltage Vpsrequired for the single power generator unit to perform the minimum voltage Vs required for the whole thermoelectric power generating apparatus to perform the power generation by the number (n) of the power generator units (Vps=Vs/n).

Next, at the subsequent step S2, the controller 100 measures the parallel voltage Vp of the power generator units. At a step S3, the controller 100 retrieves the measured parallel voltage Vpto determine whether the broken wire is formed in the corresponding power generator unit(s).

If the broken wire is found in the corresponding power generator unit(s) at the step S30 (YES), the routine returns to the step S1 and advances to steps S2 and S30.

On the other hand, if the broken wire is not found in any corresponding power generator units (NO) at step S30, the routine goes to a step S40 in which the controller 100 determines whether Vp≧Vps. If NO is determined at step S40 (Vp<Vps), the routine returns to step S2 to repeat the cycle from step S40 to step S2 until Vp≧Vps at step S40. That is to say, at step S40, the controller 100 determines whether it is the time to start the power generation.

Then, if YES (Vp≧Vps) at step S40, the routine goes to a step S50 in which the power generator units in which no broken wire is found are connected in series with each other to generate the thermoelectric power.

After the constant period of time for the power generation has been passed, the routine is again returned to step S1 in which the above-described power generation cycle is repeated.

Next, the details of the broken wire detecting block and method of detecting the occurrence of broken wire in each of the power generator units will be described below.

Each power generator unit in the case of the present invention is electrically equivalent to a series circuit having the internal resistance Ri and the power supply generating the voltage Vp.

Figure 9:
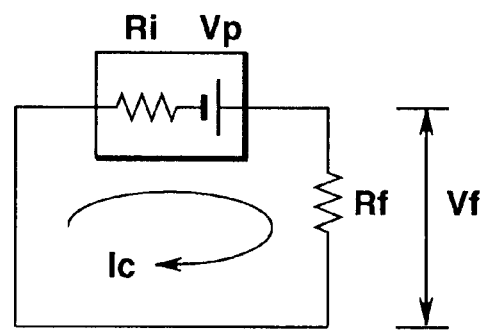
FIG. 9 is a circuit connection diagram of a representative one of the thermoelectric power generator units shown in FIG. 5A to which an external resistance is serially connected.

As shown in FIG. 9, if such a power generator unit as described above is serially connected to a suitable external resistance Rf, a closed-circuit current Ic is caused to flow and a voltage drop Vf is developed across the external resistance Rf.

It will be appreciated from FIG. 9 that when the wire in the power generator unit is broken and the internal resistance Ri becomes abnormally large, the current Ic or the voltage drop Vf will abruptly be decreased.

Hence, in the broken wire detecting block or method, utilizing the above-described abrupt drop in the current flow into or the voltage across the external resistance, if the voltage drop Vf when the external resistance Rf having the magnitude approximately equal to the internal resistance Ri of the single power generator unit or as large as 10,000 times thereof is connected in series with the power generator unit is compared with the parallel voltage Vp, the occurrence of the wire breakage in the wire can be detected.

The broken wire detecting block and method will be described in a case where the thermoelectric module constituted by the thermocouple elements serially connected to each other serves as the power generator unit.

Figure 10:
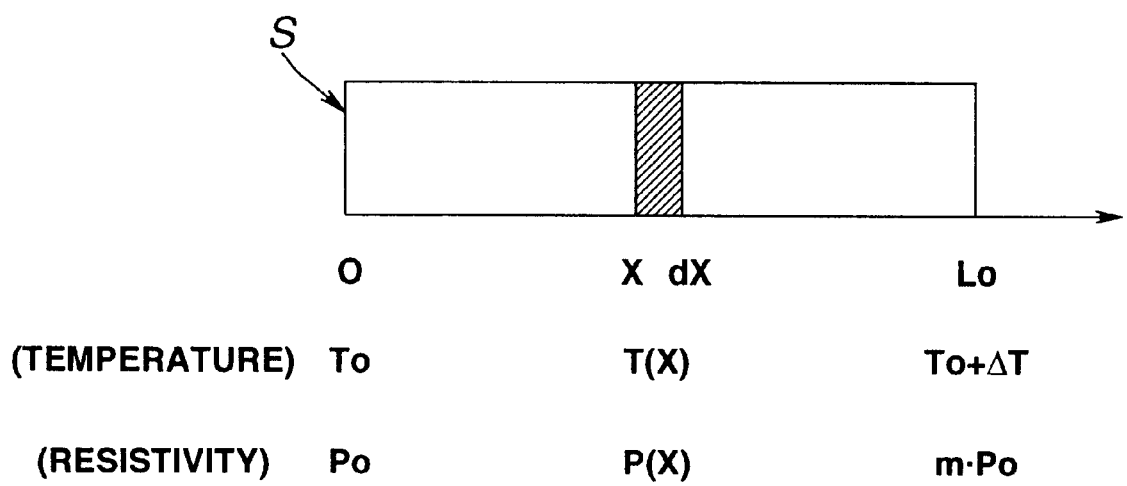
FIG. 10 is an explanatory view for explaining an electric resistance of a thermoelectric module constituting a part of the thermal power generating apparatus according to the present invention.

Suppose that an electrical resistivity (ρ) of the single thermocouple element used in the power generator unit is varied linearly to about n times an original resistivity (ρo) in an operating temperature area as shown in FIG. 10.

In this case, the following equation of the resistance R of the single -thermoelectric module is established.

$$R = \int_o^{Lo} \rho(X)dX/S \quad (1)$$

$$= \int_{To}^{To+\Delta T} \{[m+1/\Delta T(T-To)+1]1/\Delta T(\rho_o - Lo)/S\}dT$$

$$= (m+1)/2Ro.$$

In the equation (1), S denotes a cross sectional area of the single thermocouple element, To and $\rho_o$ denote temperature and electrical resistivity at a reference position and To+$\Delta$T and m $\rho_o$ denote temperature and electrical resistivity at a position separated away from the reference position by a distance Lo. It will be appreciated that the electrical resistivity (R) of the single thermoelectric module shown in FIG. 2 is varied by (m+1)/s times with respect to that at the reference position. The temperature variation of the electrical resistivity $\rho$ of the commercially available thermocouple element is generally metallic and small. If m=10, the electrical resistivity of the thermoelectric module is about five times as large as that (Ro) at the reference position.

Suppose that the thermoelectric module having the parallel voltage Vp and having the internal resistance Ri at a room temperature is connected in series with, for example, the external electrical resistance of Rf having the magnitude 100 times as large as the internal resistance Ri to form the closed circuit.

Suppose that the current flowing through the closed circuit is Ic and the voltage drop across the external resistance Rf is Vf.

Then, the following relationship is established:

(Ri+Rf)Ic=Vp, namely, Vf=Rf Vp/(Ri+Rf).

From the above-described relationship, in cases where the wire breakage in the thermoelectric module does not occur and the temperature difference between the highest temperature end and the lowest temperature end is small, the voltage drop Vf is about 0.99 Vp. In this case where the temperature difference between the highest and lowest temperature ends indicates $\Delta$T, namely, the internal resistance Ri is varied by five times, the voltage drop Vf indicates about 0.95 Vp.

On the other hand, in a case where the wire breakage occurs in the thermoelectric module and its internal electrical resistance Ri becomes abruptly large, the voltage drop Vf across the external resistance becomes abruptly small.

Hence, in the embodiment in which the external resistance Rf having the resistance value 100 times as large as the internal resistance Ri, the voltage drop Vf across the external resistance Rf becomes reduced by, for example, 10% than the parallel voltage Vp. At this time, the controller 100 can predict that some trouble in the thermoelectric module is now occurring (is about to occur).

As described above, the case where the external resistance having the magnitude 100 times as large as the internal resistance of the thermoelectric module has been explained. However, the external resistance Rf having the magnitude in a range from being equal to the internal resistance Ri to 10,000 times as large as the internal resistance may arbitrarily be selected.

In addition, a plurality of the external resistance values may also be used.

Furthermore, since the broken wire detecting block in the case of the present invention uses the value of the parallel voltage Vp, it is desirable to provide the step of detecting the occurrence of the wire breakage after the step of measurement of the parallel voltage Vp. However, there is no limitation on an order of the steps described above.

Figure 11:
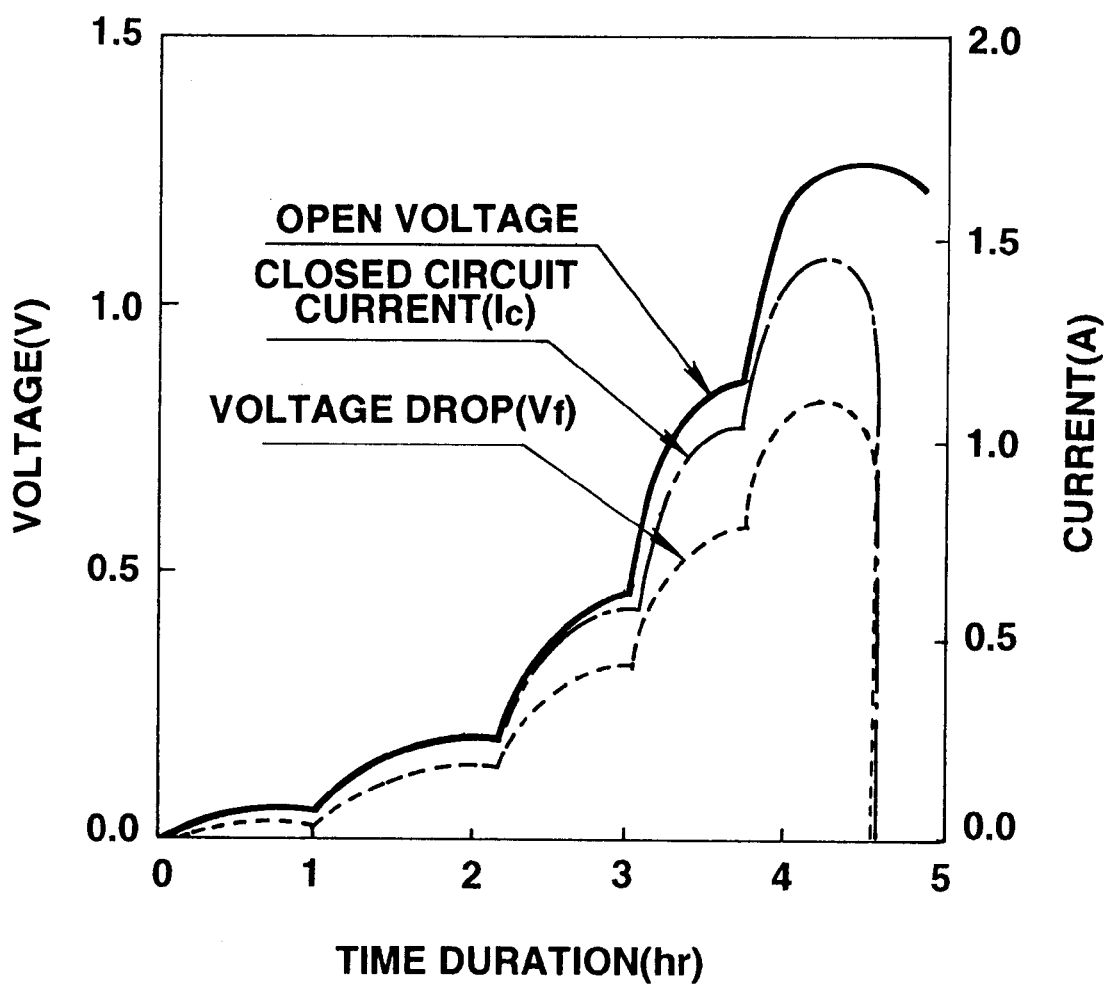
FIG. 11 is a characteristic graph presenting an open voltage, a closed circuit current when the external resistance is serially connected as shown in FIG. 9, and a voltage drop corresponding to a temperature difference $\Delta T$ between both ends of the thermoelectric module shown in FIG. 10.

Next, FIG. 11 shows measurement results of an open(-circuit) voltage of the thermoelectric module and the closed-circuit when the temperature difference $\Delta$T between the highest temperature end and the lowest temperature end was gradually increased with time and the voltage drop Vf across the external resistance Rf when the external resistance whose value was approximately equal to that of the internal resistance of the thermoelectric module was connected in series with the thermoelectric module.

After the determination as shown in FIG. 11, it was confirmed that a junction of a certain thermocouple element located at the highest temperature end and constituting the thermoelectric module was destroyed so that the wire breakage was indicated. Consequently, an efficiency of the broken wire detecting method was endorsed.

It will be appreciated from FIG. 11, that if the broken wire detecting block or method in the case of the present invention is used, a speedy detection of the wire breakage can be carried out before a complete destruction such that the open(-circuit) voltage is abruptly decreased.

Figure 12:
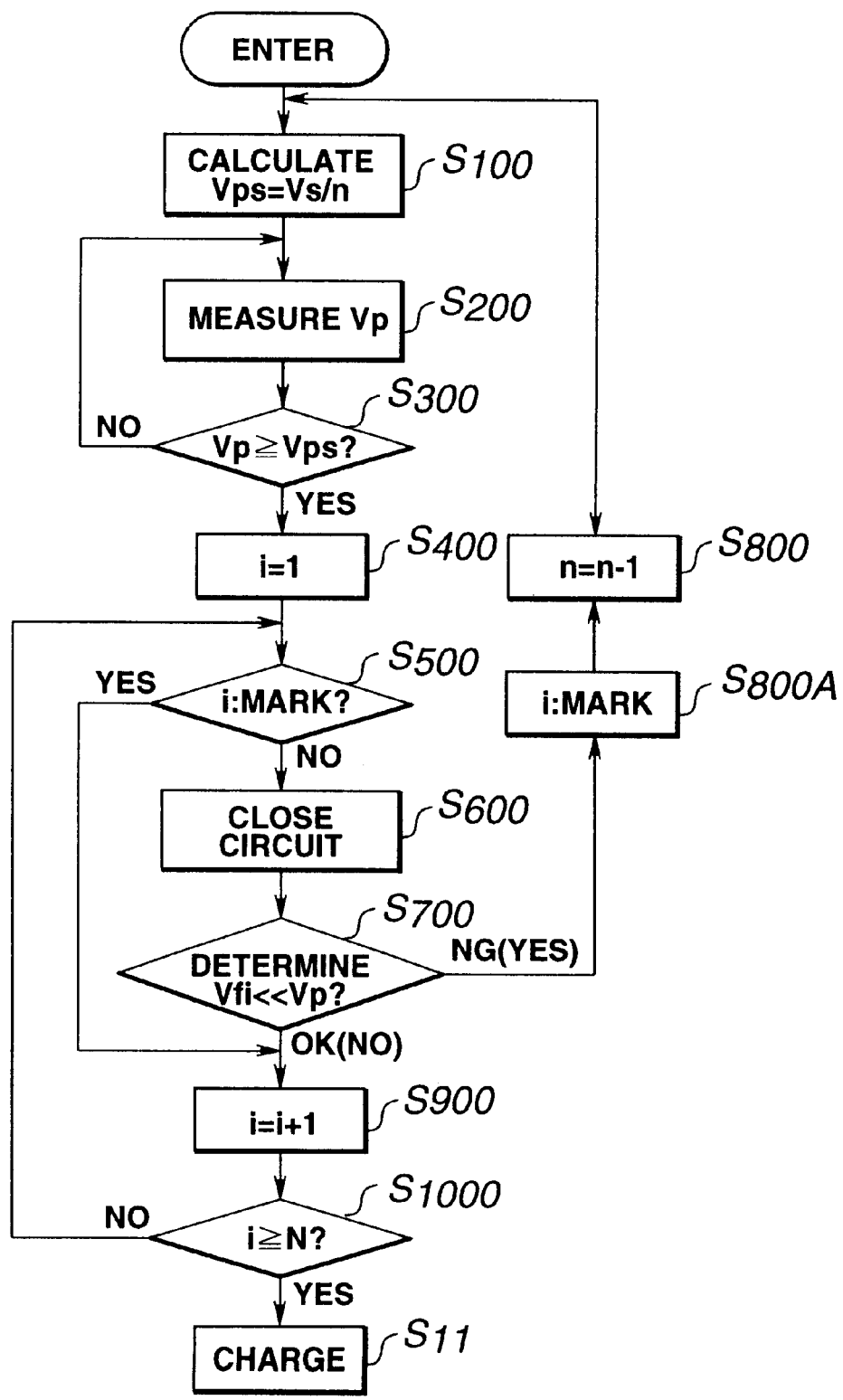
FIG. 12 is a flowchart representing a power generating cycle when an electric power using the thermal power generating apparatus according to the present invention charges a battery as an external load.

FIG. 12 shows an operational flowchart indicating a power generation cycle of the thermoelectric power generating apparatus in which the power generator units constituted by the thermoelectric module blocks 20 shown in FIG. 3 and the broken wire detecting block described above have been adopted and whose generated thermoelectric power is applicable to charging the vehicular battery.

At a step S100 of FIG. 12, the controller 100 sets the minimum voltage Vs required for the thermoelectric power generating apparatus to perform the power generation, sets the n number of the normally operated power generator units from among the total number N of the whole power generator units and calculates the division of Vs by n (Vs/n) to set the threshold voltage Vpsrequired for the single power generator unit to generate the thermoelectric power (Vps= Vs/n).

Next, at a step S200, the controller 100 measures the parallel voltage Vpof the power generator units.

At a step S300, the controller 100 compares the value of the parallel voltage Vp with the threshold voltage Vpsrequired for the power generation to determine whether Vp$\geq$Vs/n.

Next, at a step S200, the controller 100 measures the parallel voltage Vpof the power generator units.

At a step S300, the controller 100 compares the value of the parallel voltage Vp with the threshold voltage Vpsrequired for the power generation to determine whether Vp$\geq$Vps. If Vp<Vps(NO) at the step S300, the routine returns to the step S200.

This cycle is repeated until Vp$\geq$Vpsat the step S300.

Thus, if Vp$\geq$Vpsat step S300, the routine goes to a step S400 in which a counter i is set to "1".

At the subsequent step S500, the controller 100 determines whether the i-th number power generator unit has already been marked (the parallel voltage Vpof the i-th number power generator unit has been determined to be abnormal).

On the other hand, if the i-th number power generator unit has not yet been marked (NO) at the step S500, the routine goes to a step S600.

At a step S600, the controller 100 measures the voltage drop Vfi across the external resistance (for example, its resistance value is 100 times larger than the internal resistance Ri) when the i-th number power generator unit is connected in series with the external resistance Rf.

At a step S700, the controller 100 compares the value of the already measured parallel voltage Vpwith the value of the voltage drop Vfi measured at the step S600 to determine whether Vfi<<Vp.

If the value of the voltage drop Vfi is remarkably lower than the value of the parallel voltage Vp(for example, by 50% or lower) (Vfi<<Vp) at the step S700, the controller 100 determines that the i-th number power generator unit has failed (NG), i.e., has been in the wire breakage state and marks the i-th number power generator unit at a step S800A. At a step S800, the controller 100 decrements the number of the normally operated power generator units by (n−1). Then, the routine returns from the step S800 to the step S100 in which the threshold voltage Vpsis newly set as Vps=Vs/(n−1).

On the other hand, if the controller 100 determines that the i-th number power generator unit is normal (OK) at the step S700, the routine goes to a step S900 in which the counter i is incremented as i=i+1.

At a step S1000, the controller 100 compares the value of the counter i with the total number N of the whole power generator units to determine whether i>N.

If i<N (NO) at the step S1000, the routine returns to the step S500 in which the same wire breakage detection is carried out.

If the value of counter i is larger than N (i>N) at the step S1000, the routine goes to the step S11 in which the controller 100 instructs, using the control signal, the connection form switching block 60 to connect the manually operated power generator units determined at the previously processed steps in series with each other to generate the thermoelectric power, thus starting the charge into the vehicular battery.

It is noted that although the control flow shown in FIG. 12 is such that the determination of the power generation start time (step S300) is followed by the broken wire detection, in a case where the output voltage of each power generator unit is high and the combination of the serial and/or parallel connection of the power generator units is carried out, the sequence of the above determination and detection steps is not limited.

To achieve the above-described control flow, an intelligent circuitry having a combination of a switching circuit using a mechanical relay or solid-state relay, an A/D (Analog-to-Digital) converter, and a microcomputer may be used as the controller 100.

Figure 13A:
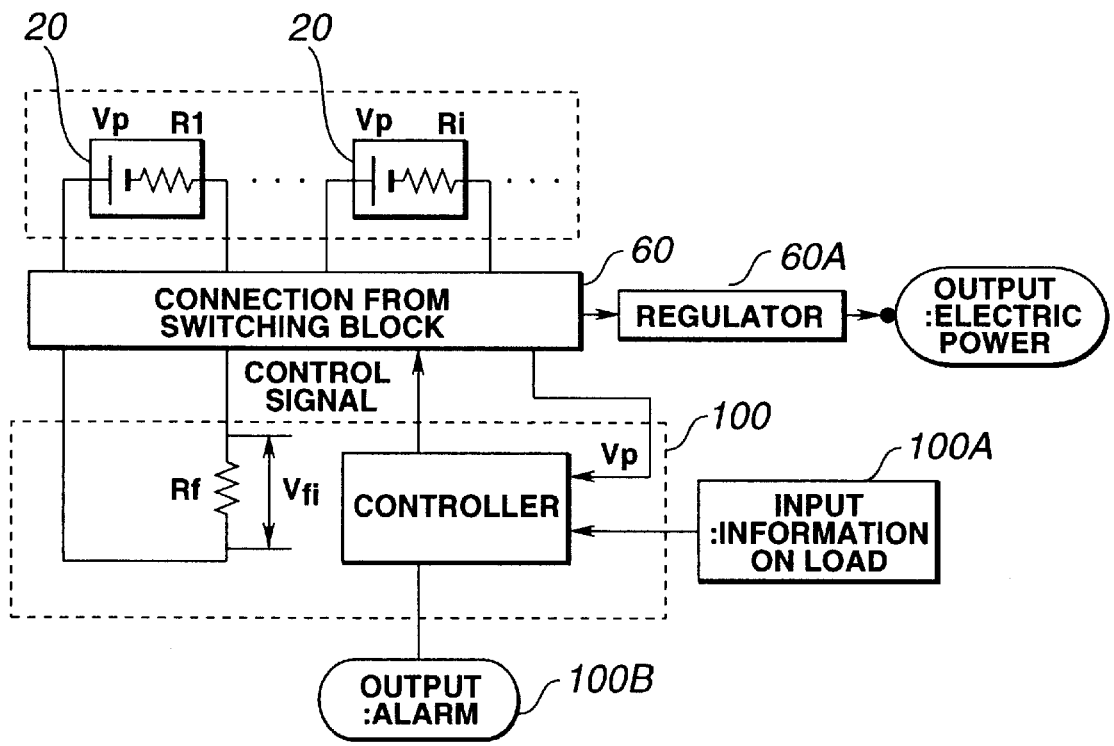
FIG. 13A is a circuit block diagram of the thermoelectric power generating apparatus according to a second preferred embodiment of the present invention.
Figure 13B:
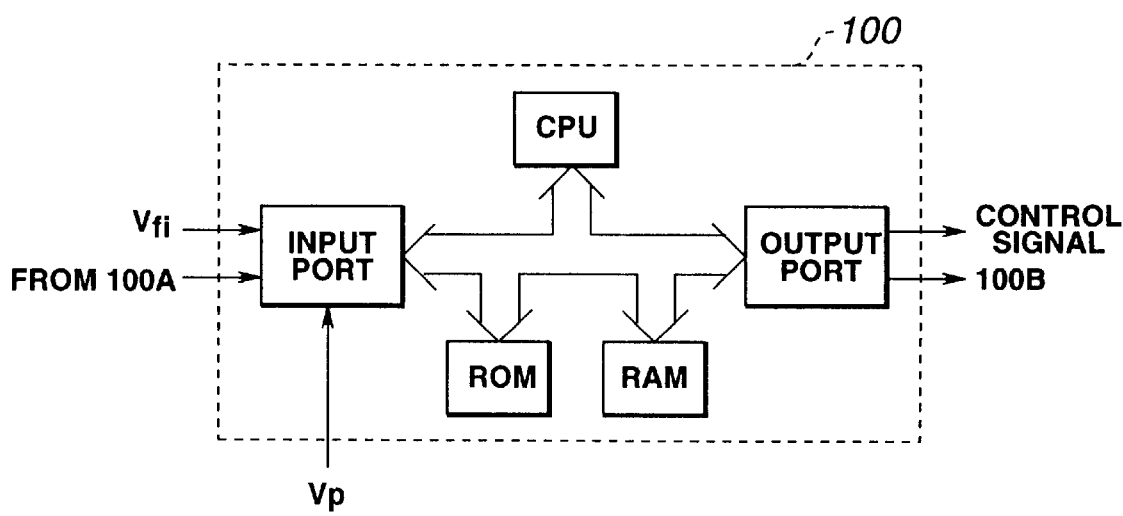
FIG. 13B is a circuit block diagram of the controller shown in FIG. 13A.

FIGS. 13A and 13B integrally show an example of the intelligent circuit described above.

As shown in FIG. 13A, a more highly accurate complex and precise control can be achieved by the controller 100, retrieving the load to be connected, the information on the heat source, and a vehicular running information on an accelerator opening angle, a gear shift ratio position, an engine torque, and so forth if the thermoelectric power generating apparatus is applicable to the automotive vehicle. If the information of the failed (wire broken) power generator unit(s) (thermoelectric module block(s)) is stored into a nonvolatile memory (ROM in FIG. 13B), the stored information can be utilized in a failure diagnosis or an alarm even after the vehicular run, i.e., the drive of the vehicle is stopped.

In the example shown in FIG. 13A, the connection form switching block 60 for switching the electrical connection of the power generator units 20 between the serial and parallel connections and the controller 100 include: the Vpmeasurement circuit for measuring the parallel voltage when any two or more of the power generator units are connected in parallel to each other; the Vfi measurement circuit for measuring the voltage drop Vfi across the external resistance Rf when each one of the respective power generator units 20 is connected in series with the external resistance Rf; a circuit for determining whether Vp≧Vps(step S300); and a circuit for comparing Vfi with Vp(step S700).

It is noted that in the above-described control flow shown in FIG. 12, the threshold voltage Vpsis determined so that the thermoelectric power generating apparatus provides the voltage as minimum as the apparatus can provide when all of the normally operated power generator units are serially connected together. However, in the actual practice, if all of the normally operated power generator units are serially connected together, the total voltage may often exceed a power generation allowable maximum voltage. In this case, the controller 100 controls the connection form switching block 60 to reduce the number of the normally operated power generator units to be connected serially and/or to combine the parallel connection of any two or more of the normally operated power generator units into the serially connected one or more of the normally operated power generator units so as to always perform optimal power generation and charging. In addition, it is possible to interpose a voltage booster between the switching circuitry and the external load.

Although, in the embodiment, both of thermoelectric module blocks (the power generator units) and the controller 100, the connection form switching block, and output block are mutually physically separated from each other, these blocks may be integrated into a single semiconductor chip.

It is noted that each thermocouple element constituting the single power generator unit is exemplified by a U.S. Pat. No. 5,498,296 issued on Mar. 12, 1996, the disclosure of which is herein incorporated by reference) and the Seebeck effect is exemplified by the U.S. Pat. No. 5,507,879 issued on Apr. 16, 1996, the disclosure of which is herein incorporated by reference).

It is also noted that the output electric power shown in FIG. 13A and connected to the voltage regulator 60A and power output shown in FIG. 1 are connected to such an external load as the vehicular battery.

TABLE 1

| Structure | ① | | ② | |
|---|---|---|---|---|
| | Rf | Pf | Rf | Pf |
| FIG. 6A | 3R | ¾ - V²/R | 3R | ¾ - V²/R |
| FIG. 6B | 3R | ⅓ - V²/R | 3R | ⅓ - V²/R |
| FIG. 6C | ½ - R | ⅜ - V²/R | 3R | ⅓ - V²/R |
| FIG. 6D | 2R | ½ - V²/R | 3R | ¹²⁄₂₅ - V²/R |

It is noted that, in Table 1, column ① indicates a case where the magnitude of the external load can be varied, column ② indicates a case where the magnitude of the external load cannot be varied, Rf denotes the external load resistance, and Pf denotes the output power to the external load.

What is claimed is:

1. A thermoelectric power generating apparatus, comprising:
    a plurality of power generator units, each power generator unit including at least one thermocouple and being capable of mutually generating an equal output voltage;
    a connection form switch for switching an electrical connection form of each one of the power generator units with respect to another of the power generator units between a serial connection and a parallel connection;

a parallel voltage detector for measuring a parallel voltage when the plurality of power generator units are connected in parallel to each other;

a connection form detector for determining the connection form of all of the power generator units, the connection form being one of three forms consisting of a serial connection, a parallel connection, and a combination of the serial and parallel connections, so as to generate a thermoelectric power according to a load connected to the thermoelectric power generating apparatus on the basis of a value of the parallel voltage measured by the parallel voltage detector; and a broken wire detector for detecting an occurrence of a wire breakage in each of the power generator units.

2. A thermoelectric power generating apparatus as claimed in claim 1, wherein the plurality of power generator units includes a plurality of thermoelectric modules having one or more thermocouples or a plurality of thermoelectric module blocks, each thermoelectric module block having the plurality of the mutually connected thermoelectric modules.

3. A thermoelectric power generating apparatus as claimed in claim 2, wherein each one of the thermoelectric modules is connected in series with the other thermoelectric modules, is connected in parallel with the other thermoelectric modules, or is connected in a combination of serial and parallel connections with the other thermoelectric modules.

4. A thermoelectric power generating apparatus as claimed in claim 3, wherein the plurality of the power generator units include the plurality of thermoelectric module blocks which are juxtaposed on an outer peripheral surface of an exhaust tube of an automotive vehicular engine and enclosed with at least one heat radiating fin, each thermoelectric module block having ten serially connected thermoelectric modules of the same ratings along a direction of a heat flow of an exhaust gas in the exhaust tube, each thermoelectric module having eight n-type thermocouple elements and p-type thermocouple elements serially connected together by means of metal electrodes and grasped by means of an electrically insulative substrate.

5. A thermoelectric power generating apparatus as claimed in claim 3, wherein the plurality of the power generator units include the plurality of the thermoelectric module blocks which are disposed on an outer wall of an incinerator and enclosed with a heat radiating fin, each thermoelectric module block having the plurality of the thermoelectric module block having the plurality of the thermoelectric modules which are connected in series with one another in a horizontal direction of the outer wall of the incinerator and whose connection number is varied linearly in a vertical direction of the outer wall of the incinerator.

6. A thermoelectric power generating apparatus as claimed in claim 4, wherein the load is a vehicular battery.

7. A thermoelectric power generating apparatus as claimed in claim 6, wherein the first comparator compares the parallel voltage (Vp) with the voltage drop (Vfi) until an i-th number of the power generator units whose measured voltage drop (Vfi) to be compared with the measured parallel voltage has reached to the whole number (N) of the power generator units.

8. A thermoelectric power generating apparatus as claimed in claim 7, wherein when the first comparator determines that the value of the measured voltage drop (Vfi) is smaller than the parallel voltage (Vp) by a predetermined percentage, the broken wire detecting block detects that the wire breakage in any one of the power generator units with which the external electrical resistance is connected in series occurs and the connection form determining block determines the connection form of each of the remaining power generator units in the form of the serial connection.

9. A thermoelectric power generating apparatus as claimed in claim 8, wherein the predetermined percentage is about 50 percents.

10. A thermoelectric power generating apparatus as claimed in claim 8, which further comprises a thermoelectric power generation time detector for determining whether it is a time for the power generator units to start a thermoelectric power generation on the basis of the measured parallel voltage Vp.

11. A thermoelectric power generating apparatus as claimed in claim 10, wherein the thermoelectric power generation time detector block comprises a setter for setting a threshold voltage (Vps) required for each of the power generator units to generate the thermoelectric power and a second comparator for comparing the threshold voltage (VPs) with the measured parallel voltage (Vp) so as to determine whether the value of the measured parallel voltage (Vp) has reached to the set threshold voltage (Vps).

12. A thermoelectric power generating apparatus as claimed in claim 11, wherein Vps=Vp/n, wherein n denotes the number of the power generator units in which no wire breakage occurs.

13. A thermoelectric power generating apparatus as claimed in claim 12, wherein the connection form detector, the broken wire detector, and the power generation start time detector are integrally constituted by a microcomputer.

14. A thermoelectric power generating apparatus as claimed in claim 13, wherein the microcomputer includes a nonvolatile memory in which the number of any one of the power generator units in which the wire breakage occurs is stored.

15. A thermoelectric power generating apparatus as claimed in claim 1, wherein the broken wire detector includes: an external resistance connected in series with each of the power generator units; a voltage drop detector for measuring a voltage drop across the external resistance when the external resistance is connected in series with each of the power generator units; and a first comparator for comparing a value of the measured voltage drop (Vfi) and the value of the parallel voltage so as to determine whether the value of the measured voltage drop is below the parallel voltage (Vp).

16. A thermoelectric power generating apparatus as claimed in claim 15, wherein the value of the external resistance falls in a range between 1 and 10,000 times as large as a resistance value of an internal resistance of each power generator unit.

17. A thermoelectric power generating apparatus as claimed in claim 16, wherein the value of the external resistance is 100 times as large as the internal resistance of each power generator unit.

18. A thermoelectric power generating apparatus, comprising:

a plurality of power generator units, each power generator unit including at least one thermocouple and being capable of mutually generating an equal output voltage;

connection form switching means for switching an electrical connection form of each one of the power generator units between a serial connection of the corresponding one of the power generator units to another of the remaining power generator units and a parallel connection thereof to another of the remaining power generator units;

parallel voltage measuring means for measuring a parallel voltage when the plurality of power generator units are connected in parallel to each other;

connection form determining means for determining the connection form of all of the power generator units in one of three forms consisting of a serial connection, a parallel connection, and a combination of the serial and parallel connections, so as to generate a thermoelectric power according to a load connected to the thermoelectric power generating apparatus on the basis of a value of the parallel voltage measured by the parallel voltage measuring means; and broken wire detecting means for detecting whether a wire breakage in each of the power generator units occurs.

19. A method for driving a thermoelectric power generating apparatus, the thermoelectric power generating apparatus comprising:

a plurality of power generator units, each power generator unit including at least one thermocouple and being capable of mutually generating an equal output voltage;

a connection form switch for switching an electrical connection form of each one of the power generator units with respect to another of the power generator units between a serial connection and a parallel connection a parallel voltage detector for measuring a parallel voltage when the plurality of power generator units are connected in parallel to each other;

a connection form detector for determining the connection form of all of the power generator units in one of three forms consisting of a serial connection, a parallel connection, and a combination of the serial and parallel connections, so as to generate a thermoelectric power according to a load connected to the thermoelectric power generating apparatus on the basis of a value of the parallel voltage measured by the parallel voltage measuring block; and a broken wire detector for detecting whether a wire breakage in each of the power generator units occurs;

the method comprising the steps of:

measuring the parallel voltage of the power generator units connected in parallel with each other through the parallel voltage measuring block;

detecting whether a wire breakage in each of the power generator units occurs;

determining a thermoelectric power start time at which the thermoelectric power generating apparatus starts the thermoelectric power generation from the measured parallel voltage;

determining the connection form of the power generator units in the three forms; and interconnecting the power generator units in the determined connection form to generate the thermoelectric power.

20. A method for driving a thermoelectric power generating apparatus as claimed in claim 19, wherein the steps of determining are executed simultaneously and wherein the detecting step is executed utilizing a value of the parallel voltage measured at the measuring step whenever the measuring step, the first and second determining steps, and the power generating step are repeated.

* * * * *